US011522130B2

(12) United States Patent
Morris et al.

(10) Patent No.: US 11,522,130 B2
(45) Date of Patent: Dec. 6, 2022

(54) METAL INSULATOR TRANSITION FIELD PROGRAMMABLE ROUTING BLOCK

(71) Applicant: Intel Corporation, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 1014 days.

(21) Appl. No.: 16/022,685

(22) Filed: Jun. 28, 2018

(65) Prior Publication Data

US 2020/0006651 A1    Jan. 2, 2020

(51) Int. Cl.
*H01L 45/00* (2006.01)
*H01L 23/528* (2006.01)
*H01L 27/24* (2006.01)
*H03K 19/0175* (2006.01)

(52) U.S. Cl.
CPC ........ *H01L 45/1206* (2013.01); *H01L 23/528* (2013.01); *H01L 27/2463* (2013.01); *H01L 45/1233* (2013.01); *H01L 45/1608* (2013.01); *H03K 19/017581* (2013.01)

(58) Field of Classification Search
CPC ............... H01L 45/1206; H01L 23/528; H01L 27/2463; H01L 45/1233; H01L 45/1608; H03K 19/017581
See application file for complete search history.

(56) References Cited

U.S. PATENT DOCUMENTS

| | | | |
|---|---|---|---|
| 10,096,362 B1* | 10/2018 | Nazarian | G11C 13/004 |
| 2007/0029676 A1* | 2/2007 | Takaura | G11C 13/0004 |
| | | | 257/758 |
| 2009/0231913 A1* | 9/2009 | Tonomura | G11C 7/04 |
| | | | 365/163 |
| 2018/0165396 A1* | 6/2018 | Lin | G11C 7/1012 |
| 2019/0115054 A1* | 4/2019 | Luo | G11C 11/5678 |

* cited by examiner

*Primary Examiner* — Fernando L Toledo
*Assistant Examiner* — Neil R Prasad
(74) *Attorney, Agent, or Firm* — Schwabe, Williamson & Wyatt, P.C.

(57) ABSTRACT

A routing structure is disclosed. A first wiring line coupled to a programming access device and a routing block driver and receiver enabling device and a second wiring line coupled to a programming access device and a routing block driver and receiver enabling device. An insulator-metal-transistor device that includes a top electrode, a middle electrode and a bottom electrode, coupled at the intersection of the first wiring line and the second wiring line.

20 Claims, 7 Drawing Sheets

METAL INSULATOR TRANSITION FIELD PROGRAMMABLE ROUTING BLOCK

TECHNICAL FIELD

Embodiments of the disclosure pertain to field programmable routing blocks and, in particular, to metal-insulator-transition field programmable routing blocks.

BACKGROUND

There are increasing uses for field-Programmable Gate Arrays (FPGAs) in today's evolving datacenter. This utility requires area-efficient scaled fabrication of integrated circuits that include configurable logic functions and routing. This circuitry is conventionally implemented with SRAM (to store configuration state) and MOSFET (to implement logic and interconnect configuration).

Conventional approaches suffer from the high leakage characteristics of SRAM and the area inefficiency of connecting SRAM and MOSFETs on silicon surfaces to routing inputs and outputs in backend metals. Alternative approaches integrate RRAM devices at routing cross-points. However, problems with such alternative approaches include high-voltage requirements, low endurance, and current sensitivity to disturb voltages.

Using SRAM and MOSFETs for routing and logic reconfiguration has significant leakage power, routing overhead and area cost consequences. In order to selectively couple routing wire, there must be multiple options for the possible couplings in each routing configuration block. For example, a single configurable coupling includes: input and output wires that must be routed from the backend to a frontend MOSFET reconfiguration switch (the front-end MOSFET reconfiguration switch that can be a complementary pass transistor switch or a tristate buffer) (area cost), an output of a MOSFET reconfiguration switch that must be routed to the far backend, one or more control signals that must be routed to the input of the reconfiguration switch (for example, 'enable' and 'enable b' that are routed to the complementary pass transistor circuit), a control signal that may be driven and stored by an SRAM configuration bitcell (area cost and leakage), and an SRAM configuration bitcell that may be in an array and be addressable with word line and bit line connections to enable updating of FPGA configuration. Thus, even a single routing connection in an FPGA requires substantial overhead in routing front-end devices.

In another approach RRAM devices may be used to both store configuration states and effect coupling between input and output logic as a part of routing and logic configuration operations. However, this approach has significant drawbacks. In particular, most RRAM has a limited number of endurance cycles (approximately 1e5). Also, RRAM Ron/Roff ratios are low such that using RRAM in logic (versus memory) consumes excessive static power. Additionally, RRAM memory windows can be small, causing the RRAM to be disturbed by logic signals in propagation mode.

DESCRIPTION OF THE EMBODIMENTS

Metal-insulator-transition field programmable routing blocks are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Conventional field programmable gate array (FPGA) routing blocks that are implemented with SRAM to store configuration states and MOSFETs to implement logic and interconnect configuration exhibit high leakage and area inefficiency associated with connecting SRAM and MOSFETs on silicon surface to routing inputs and outputs in backend metals. A process and device that overcomes the shortcomings of conventional approaches is disclosed herein. As part of the disclosed process, the problem of area inefficiency is addressed through the use of insulator-metal-transition (IMT) devices that enable a significant increase in the density of configurable routing and logic hardware. Increasing the density of configurable routing and logic hardware improves performance and lowers cost. In addition, the problem of FPGA power leakage is addressed by the lower leakage characteristics of the IMT devices that are used as compared to the SRAM transistors of previous approaches. The configuration state is stored in memory, but is separate from the signal propagation path such that ultra-low leakage SRAM transistors or non-volatile memory can be used.

In an embodiment, the IMT devices are configured to dynamically hold the routing and logic hardware configuration state of field configurable routing and logic hardware and to selectively couple or isolate inputs and outputs in field configurable routing and logic hardware. The IMT device is integrated in an FPGA backend. In contrast to conventional selector applications, the IMT device is integrated without a cross-point RRAM device, uses material suitable for low-voltage high-endurance application, and is designed with long hysteresis.

Figure 1A:
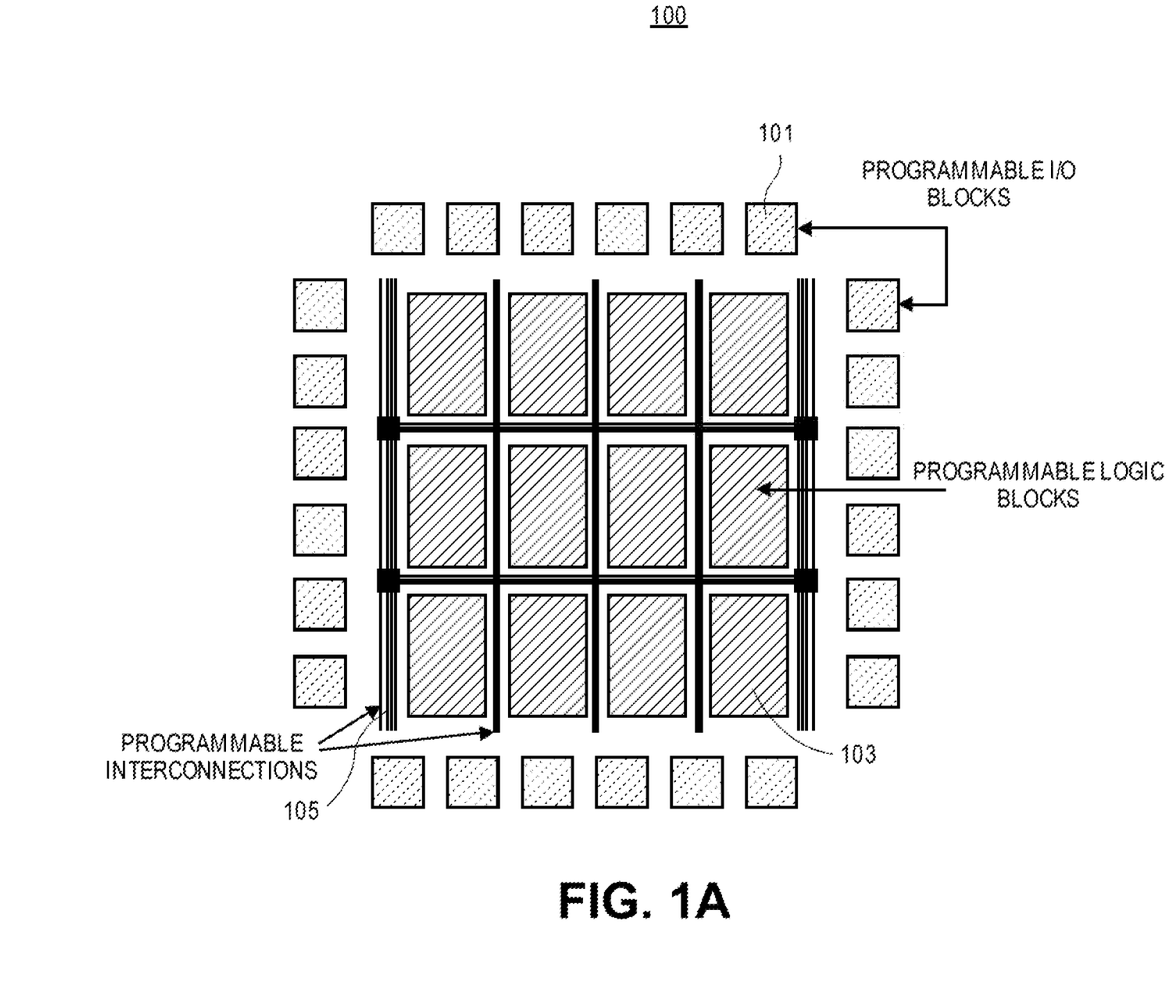
FIG. 1A is an illustration of a conventional field programmable gate array (FPGA) architecture.

FIG. 1A is an illustration of a conventional FPGA architecture 100. FIG. 1A shows programmable input/output (I/O) blocks 101, programmable logic blocks 103 and programmable interconnections 105.

Referring to FIG. 1A, the programmable I/O blocks 101 are used to couple the programmable logic blocks 103 and the programmable interconnections 105 (the routing architecture) to external components. The programmable logic blocks 103 includes the basic computation and storage elements used in digital systems. The programmable interconnections 105 establish connections between the programmable logic blocks 103 and the programmable I/O blocks 101 that enable the completion of user-defined design units. The programmable interconnections 105 consist of wiring segments that span individual logic blocks before terminating at switch box (see FIG. 1B). By turning on some of the programmable switches within a switch box, programmable logic and/or longer paths can be constructed. The switch block can include multiplexers, pass transistors and tri-state buffers. The pass transistors and multiplexers can be used to connect the logic elements.

Figure 1B:
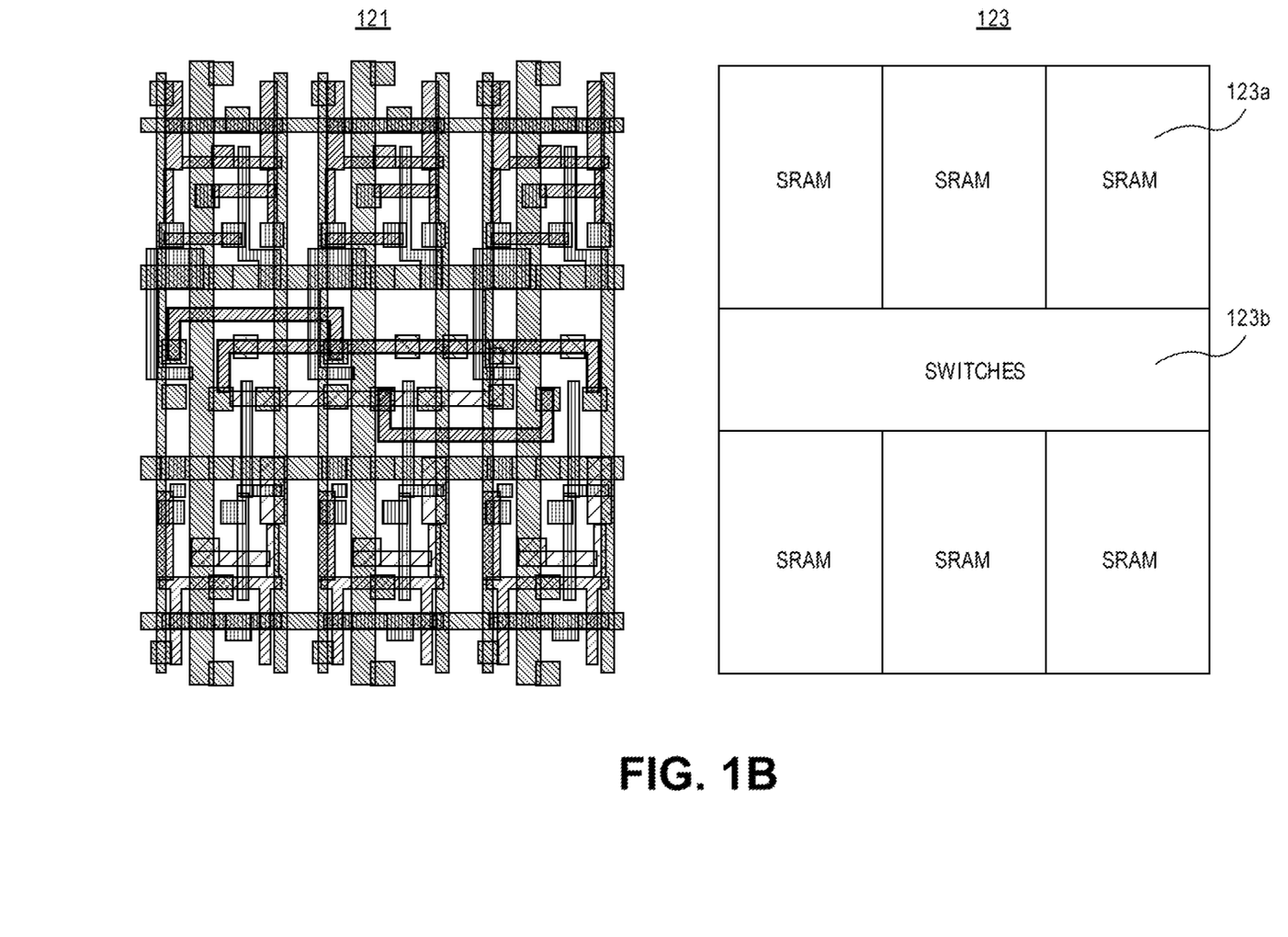
FIG. 1B illustrates a switch block of a previous approach that includes static random access memory (SRAM) and switching components.

FIG. 1B illustrates a switch block of a previous approach that includes SRAM and switching components. FIG. 1B shows a layout 121 of a switch block that includes SRAM and switch components and a schematic 123 of the switch block that shows the boundaries of the SRAM and switch components. In the FIG. 1B approach, the configuration SRAM 123a consumes the first two levels of metal and input routing and output wiring may be in the third layer of metal (or higher levels for lower resistance). The input routing and the output wiring uses metal and via routing in order to access the configurable switches 123b. For example, the input routing and the output wiring uses a metal and via routing path that includes a coupling of metal level three to via level two, metal level two to via level one, and metal level one to the contact the contact layer, in order to access configurable switches 123b.

The extensive routing described above introduces RC delay and excessively consumes area. The frontend switches consume area as well. In addition, the SRAM 123a exhibits high leakage power. High leakage power can be a negative side effect of scaling that increases dramatically with scaling. Consequently, the use of SRAM and MOSFETs for routing and logic reconfiguration has significant leakage power, routing overhead and area (cost) consequences.

Figure 2A:
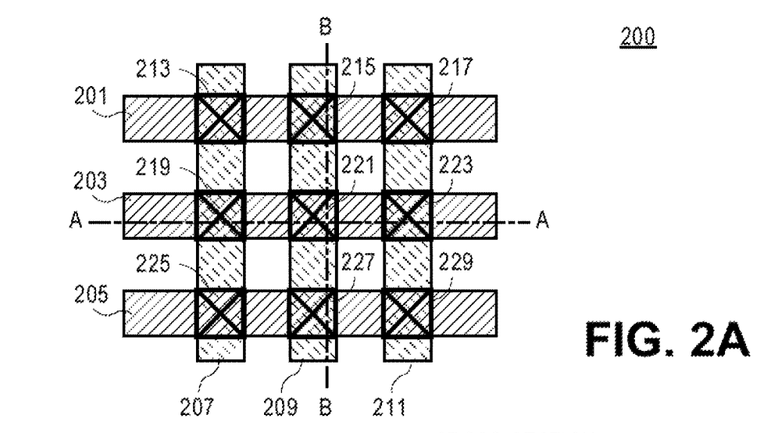
FIG. 2A is an illustration of the structure of an insulator-metal-transition (IMT) routing block according to an embodiment.

FIG. 2A is an illustration of components of an IMT routing block 200 according to an embodiment. FIG. 2A shows horizontal routing line 201, horizontal routing line 203, horizontal routing line 205, vertical routing line 207, vertical routing line 209, vertical routing line 211, IMT device 213, IMT device 215, IMT device 217, IMT device 219, IMT device 221, IMT device 223, IMT device 225, IMT device 227 and IMT device 229.

Referring to FIG. 2A, the IMT devices 213-229 are located at the intersection of the horizontal routing lines 201-205 and the vertical routing lines 207-211. The IMT device 213 is located at the intersection of the horizontal routing line 201 and the vertical routing line 207. The IMT device 215 is located at the intersection of the horizontal routing line 201 and the vertical routing line 209. The IMT device 217 is located at the intersection of the horizontal routing line 201 and the vertical routing line 211. The IMT device 219 is located at the intersection of the horizontal routing line 203 and the vertical routing line 207. The IMT device 221 is located at the intersection of the horizontal routing line 203 and the vertical routing line 209. The IMT device 223 is located at the intersection of the horizontal routing line 203 and the vertical routing line 211. The IMT device 225 is located at the intersection of the horizontal routing line 205 and the vertical routing line 207. The IMT device 227 is located at the intersection of the horizontal routing line 205 and the vertical routing line 209. The IMT device 229 is located at the intersection the horizontal routing line 205 and the vertical routing line 211.

In an embodiment, the horizontal routing line 201, the horizontal routing line 203, and the horizontal routing line 205 can be formed from materials such as nickel, titanium nitride and tungsten. In other embodiments, the horizontal routing line 201, the horizontal routing line 203 and the horizontal routing line 205 can be formed from other material. In an embodiment, the vertical routing line 207, the vertical routing line 209 and the vertical routing line 211 can be formed from materials such as nickel, titanium nitride and tungsten. In other embodiments, the vertical routing line 207, the vertical routing line 209 and the vertical routing line 211 can be formed from other materials. In an embodiment, the IMT material of the IMT device 213, the IMT device 215, the IMT device 217, the IMT device 219, the IMT device 221, the IMT device 223, the IMT device 225, the IMT device 227 and the IMT device 229 can be formed from $V_4O_7$, $V6O_{11}$, $V_2O_3$, $V_5O_9$, $Ti_4O_7$ and $Fe_3O_4$. In other embodiments, the IMT material of the IMT device 213, the IMT device 215, the IMT device 217, the IMT device 219, the IMT device 221, the IMT device 223, the IMT device 225, the IMT device 227 and the IMT device 229 can be formed from other materials.

Figure 3:
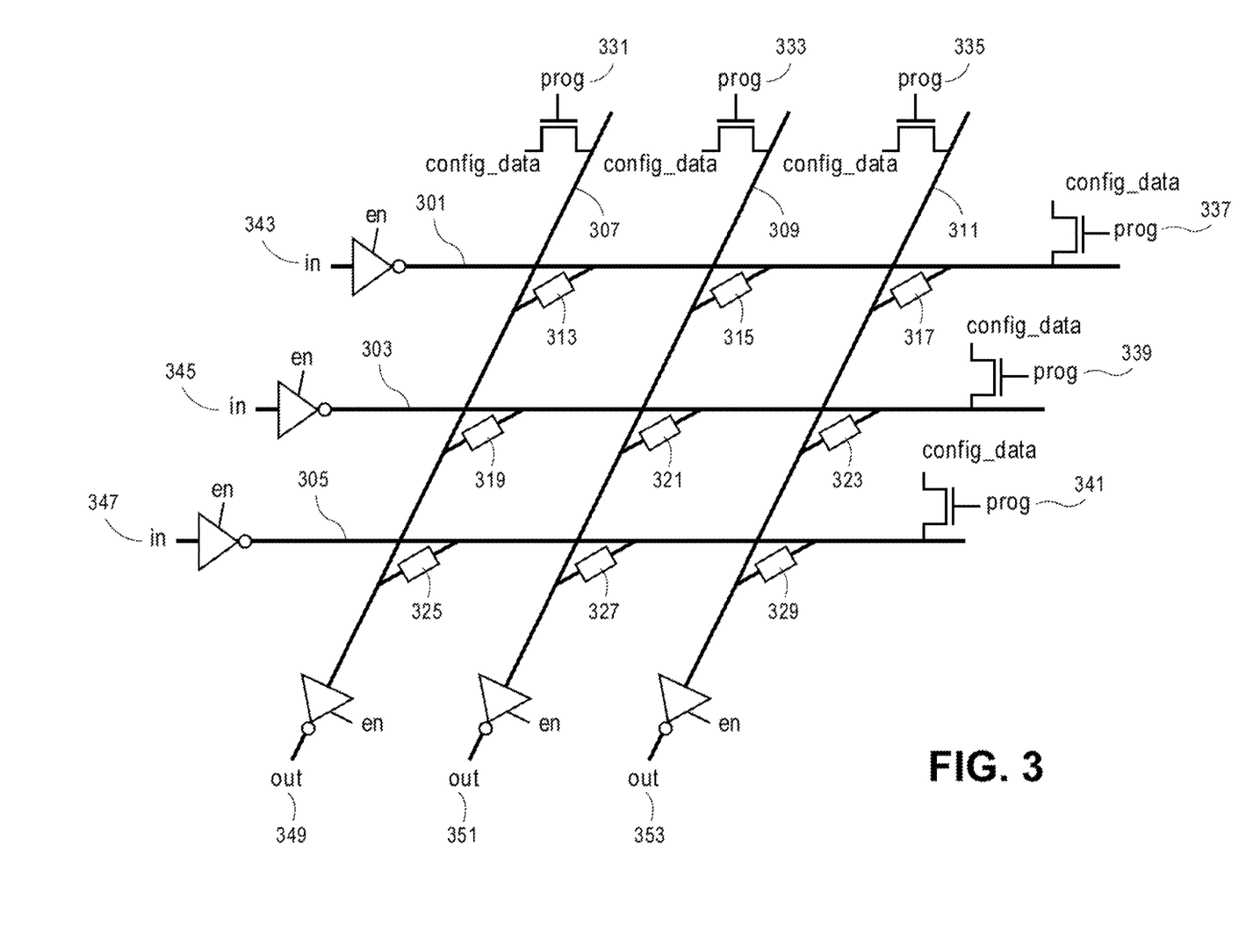
FIG. 3 is an illustration of IMT routing block circuitry according to an embodiment.

In operation, during programming, transistors associated with the horizontal routing lines 201-205 and the vertical routing lines 207-211 connect the IMT devices 213-229 to global bitlines. Programming voltages are sequentially applied to the horizontal routing lines 201-205 and the vertical routing lines 207-211 to begin the configuration process. Initially, the IMT devices 213-229 are set to the RHIGH state (e.g., the non-conductive state). Next, selected IMT devices are set to the RLOW state (e.g., the conductive state) to enable electrical signals to propagate through selected routes. The routes are selected based on the logic function that is programmed. The states that enable electrical signals to propagate through the selected routes are dynamically held and periodically refreshed. In particular, in an embodiment, the states can be held for milliseconds between refreshes. In other embodiments, the states can be held for other periods of time between refreshes. In an embodiment, the state that is programmed can be stored in SRAM or non-volatile memory that can be physically integrated under the back-end matrix of the die region associated with the selected routes. In other embodiments, the state can be stored in a separate die region or on a separate die. Referring to FIG. 3, during logic operation, the routing block drivers and receivers are enabled and the programming access transistors are disabled. The routing block operates by allowing signal propagation through the RLOW IMT devices.

Figure 2B:
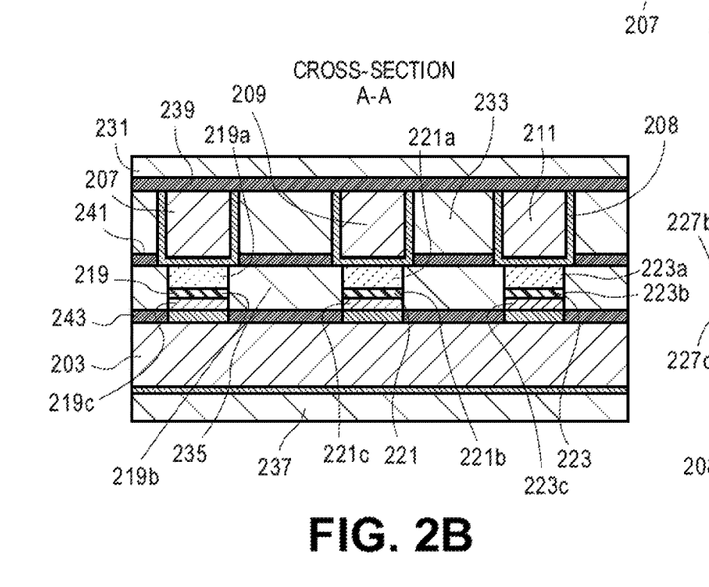
FIG. 2B shows a cross sectional perspective of an IMT routing block viewed along line AA according to an embodiment.

FIG. 2B shows a cross sectional perspective of components of the IMT routing block 200 viewed along line AA according to an embodiment. FIG. 2B shows vertical routing line 207, vertical routing line 209 and vertical routing line 211, IMT device 219, IMT 221, IMT 223, horizontal routing line 203, interlayer dielectric 231, interlayer dielectric 233, interlayer dielectric 235, interlayer dielectric 237, stop layer 239, stop layer 241 and stop layer 243. The IMT device 219 includes upper electrode 219a, IMT material 219b and bottom electrode 219c, the IMT device 221 includes upper electrode 221a, IMT material 221b and bottom electrode 221c, and the IMT device 223 includes upper electrode 223a, IMT material 223b and bottom electrode 223c.

Referring to FIG. 2B, the vertical routing line 207 is formed above the IMT device 219. The IMT device 219 is formed above the horizontal routing line 203. The vertical routing line 209 is formed above the IMT device 221. The IMT device 221 is formed above the horizontal routing line 203. The vertical routing line 211 is formed above the IMT device 223. The IMT device 223 is formed above the horizontal routing line 203.

In an embodiment, lining 208 on surfaces of vertical routing lines 207, 209 and 211 can be formed from a Cu diffusion barrier refractory nitride material such as TiN and TaN. In other embodiments, the lining 208 on the surfaces of vertical routing lines 207, 209 and 211 can be formed from other materials. In an embodiment, the vertical routing line 207, the vertical routing line 209 and the vertical routing line 211 can be formed from materials such as nickel, titanium nitride or tungsten. In other embodiments, the vertical routing line 209 and the vertical routing line 211 can be formed from other material. In an embodiment, the IMT material of the IMT device 219, the IMT device 221 and the IMT device 223 can be formed from $V_4O_7$, $V_6O_{11}$, $V_2O_3$, $V_5O_9$, $Ti_4O_7$ and $Fe_3O_4$. In other embodiments, the IMT material of the IMT device 219, the IMT device 221 and the IMT device 223 can be formed from other materials. In an embodiment, the horizontal routing line 203 can be formed from materials such as nickel, titanium nitride or tungsten. In other embodiments, the horizontal routing line 203 can be formed from other materials. In an embodiment, the interlayer dielectric 231, the interlayer dielectric 233, the interlayer dielectric 235 and the interlayer dielectric 237 can be formed from an oxide. In other embodiments, the interlayer dielectric 231, the interlayer dielectric 233, the interlayer dielectric 235 and the interlayer dielectric 237 can be formed from other materials. In an embodiment, the etch stop layer 239, the etch stop layer 241 and the etch stop layer 243 can be formed from silicon nitride. In other embodiments, the etch stop layer 239, the etch stop layer 241 and the etch stop layer 243 can be formed from other materials.

In operation, during programming, the IMT device 219, the IMT device 221 and the IMT device 223 are used to enable electrical signals to propagate through selected routes. For example, if a route is selected that includes vertical routing line 209 and horizontal routing line 203, the IMT device 221 that is located at the intersection of these routing lines is used. In an embodiment, as part of the programming, initially, the IMT device 221 is set to the RHIGH state. Next, the IMT device 221 is set to the RLOW state to enable electrical signals to propagate through the selected route. The selected route connects components that are a part of the logic function that is programmed. In an embodiment, IMT device 219 and IMT device 223 are activated in the same manner if they are part of selected routes. The states that enable electrical signals to propagate through the selected routes are dynamically held and periodically refreshed. In particular, in an embodiment, the states can be held for milliseconds between refreshes. In other embodiments, the states can be held for other periods of time. In an embodiment, the state that is programmed can be stored in SRAM or non-volatile memory that is physically integrated under the back-end matrix of the die region associated with the selected routes. In other embodiments, the state can be stored in a separate die region or on a separate die. Referring to FIG. 3, during logic operation, the routing block drivers and receivers are enabled and the programming access transistors are disabled. The routing block operates by allowing signal propagation through the RLOW IMT devices.

Figure 2C:
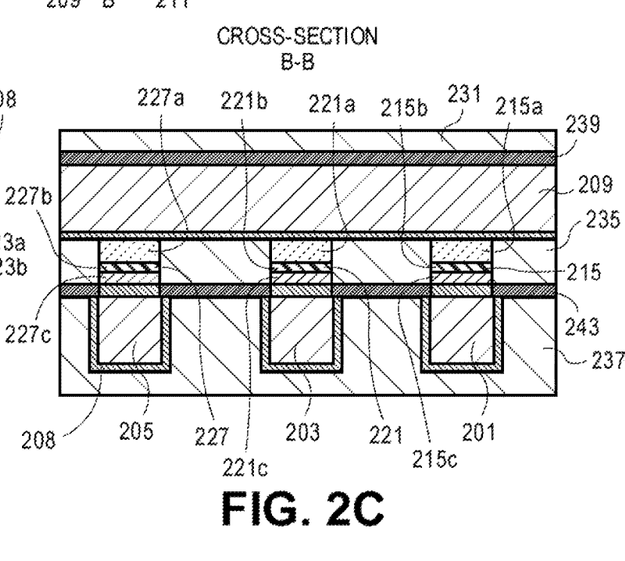
FIG. 2C shows a cross sectional perspective of an IMT routing block viewed along line BB according to an embodiment.

FIG. 2C shows a cross sectional perspective of components of the IMT routing block 200 viewed along line BB according to an embodiment. FIG. 2C shows vertical routing line vertical routing line 209, IMT device 215, IMT device 221, IMT device 227, horizontal routing line 201, horizontal routing line 203, horizontal routing line 205, interlayer dielectric 231, interlayer dielectric 235, interlayer dielectric 237, stop layer 239 and stop layer 243. The IMT device 215 includes top electrode 215a, IMT material 215b and bottom electrode 215c, IMT device 221 includes top electrode 221a, IMT material 221b and bottom electrode 221c, and IMT device 227 includes top electrode 227a, IMT material 227b and bottom electrode 227c.

Referring to FIG. 2C, vertical routing line 209 is formed above the IMT device 227, the IMT device 221 and the IMT device 215. The horizontal routing line 205 is formed underneath the IMT device 227. The horizontal routing line 203 is formed underneath the IMT device 221. The horizontal routing line 201 is formed underneath the IMT device 215.

In an embodiment, the lining 208 on surfaces of the horizontal routing lines 201, 203 and 205 can be formed from a Cu diffusion barrier refractory nitride material such as TiN and TaN. In other embodiments, the lining 208 on the surfaces of the horizontal routing lines 201, 203 and 205 can be formed from other materials. In an embodiment, the vertical routing line 209, the horizontal routing line 205, the horizontal routing line 203 and the horizontal routing line 201 can be formed from materials such as nickel, titanium nitride or tungsten. In other embodiments, the vertical routing line 209, the horizontal routing line 205, the horizontal routing line 203 and the horizontal routing line 201 can be formed from other materials. In an embodiment, the IMT material of the IMT device 227, the IMT device 221, and the IMT device 215 can be formed from $V_4O_7$, $V_6O_{11}$, $V_2O_3$, $V_5O_9$, $Ti_4O_7$ and $Fe_3O_4$. In other embodiments, the IMT material of the IMT device 227, the IMT device 221, and the IMT device 215 can be formed from other material. In an embodiment, the interlayer dielectric 231, the interlayer dielectric 235 and the interlayer dielectric 237 can be formed from material such as silicon dioxide. In other embodiments, interlayer dielectric 231, interlayer dielectric 235 and interlayer dielectric 237 can be formed from other materials. In an embodiment, the etch stop layer 239 and the etch stop layer 243 can be formed from material such as silicon nitride. In other embodiments, the etch stop layer 239 and the etch stop layer 243 can be formed from other materials.

In operation, during programming, IMT devices 215, IMT device 221 and IMT device 227 are used to enable electrical signals to propagate through selected routes. For example, if a route is selected that includes vertical routing line 209 and horizontal routing line 203, the IMT device 221 that is located at the intersection of these routing lines is used. In an embodiment, as part of the programming, initially, the IMT device 221 is set to the RHIGH state. Next, the IMT device 221 is set to the RLOW state to enable electrical signals to propagate through the selected route. The selected route connects components that are a part of the logic function that is programmed. In an embodiment, IMT device 215 and IMT device 227 can be activated in the same manner if they are part of selected routes. The states that enable electrical signals to propagate through the selected routes are dynamically held and periodically refreshed. In particular, in an embodiment, the states can be held for milliseconds between refreshes. In other embodiments, the states can be held for other periods of time between refreshes. In an embodiment, the state that is programmed can be stored in SRAM or non-volatile memory that is physically integrated under the back-end matrix of the die region associated with the selected routes. In other embodiments, the state can be stored in a separate die region or on a separate die. Referring to FIG. 2, during logic operation, the routing block drivers and receivers are enabled and the programming access transistors are disabled. The routing block operates by allowing signal propagation through the RLOW IMT devices.

FIG. 3 is an illustration of circuit components of an IMT routing block 300 according to an embodiment. FIG. 3 shows horizontal routing line 301, horizontal routing line 303, horizontal routing line 305, vertical routing line 307, vertical routing line 309, vertical routing line 311, IMT device 313, IMT device 315, IMT device 317, IMT device 319, IMT device 321, IMT device 323, IMT device 325, IMT device 327 and IMT device 329. In addition, FIG. 3 shows configuration switch 331, configuration switch 333, configuration switch 335, configuration switch 337, configuration switch 339, configuration switch 341, input enable 343, input enable 345, input enable 347, output enable 349, output enable 351 and output enable 353.

Referring to FIG. 3, the IMT device 313 is located at the intersection of horizontal routing line 301 and vertical routing line 307. The IMT device 315 is located at the intersection of horizontal routing line 301 and vertical routing line 309. The IMT device 317 is located at the intersection of the horizontal routing line 301 and the vertical routing line 311. The IMT device 319 is located at the intersection of horizontal routing line 303 and vertical routing line 307. The IMT device 321 is located at the intersection of horizontal routing line 303 and vertical routing line 309. The IMT device 323 is located at the intersection of horizontal routing line 303 and vertical routing line 311. The IMT device 325 is located at the intersection of horizontal routing line 305 and vertical routing line 307. The IMT device 327 is located at the intersection of horizontal routing line 305 and vertical routing line 309. The IMT device 329 is located at the intersection the horizontal routing line 305 and the vertical routing line 311.

In an embodiment, the horizontal routing line 301, the horizontal routing line 303, and the horizontal routing line 305 can be formed from nickel, titanium nitride and tungsten. In other embodiments, the horizontal routing line 301, the horizontal routing line 303 and the horizontal routing line 305 can be formed from other material. In an embodiment, the vertical routing line 307, the vertical routing line 309 and the vertical routing line 311 can be formed from nickel, titanium and tungsten. In other embodiments, the vertical routing line 307, the vertical routing line 309 and the vertical routing line 311 can be formed from other materials. In an embodiment, the IMT material in IMT device 313, IMT device 315, IMT device 317, IMT device 319, IMT device 321, IMT device 323, IMT device 325, IMT device 327 and IMT device 329 can be formed from materials such as $V_4O_7$, $V_6O_{11}$, $V_2O_3$, $V_5O_9$, $Ti_4O_7$ and $Fe_3O_4$. In other embodiments, the IMT material in IMT device 313, IMT device 315, IMT device 317, IMT device 319, IMT device 321, IMT device 323, IMT device 325, IMT device 327 and IMT device 329 can be formed from other materials.

In operation, during programming, the IMT device 313, the IMT device 315 and the IMT device 317, the IMT device 319, the IMT device 321, the IMT device 323, the IMT device 325, the IMT device 327, and the IMT device 329 are used to enable electrical signals to propagate through selected routes. For example, if a route is selected that includes the vertical routing line 309 and the horizontal routing line 301, the IMT device 315 that is located at the intersection of these routing lines is used. In an embodiment, as part of the programming, initially, the IMT device 315 is set to the RHIGH state. Next, the IMT device 315 is set to the RLOW state to enable electrical signals to propagate through the selected route. The selected route connects components that are a part of the logic function that is programmed. In an embodiment, the IMT device 313, the IMT device 317, the IMT device 319, the IMT device 321, the IMT device 323, the IMT device 325, the IMT device 327, and the IMT device 329 are activated in the same manner if they are part of selected routes. The states that enable electrical signals to propagate through the selected routes are dynamically held and periodically refreshed. In particular, in an embodiment, the states can be held for milliseconds between refreshes. In other embodiments, the states can be held for other periods of time between refreshes. In an embodiment, the state that is programmed can be stored in SRAM or non-volatile memory that is physically integrated under the back-end matrix of the die region associated with the selected routes. In other embodiments, the state can be stored in a separate die region or on a separate die. Referring to FIG. 3, during logic operation, the routing block drivers and receivers are enabled and the programming access transistors are disabled. The routing block operates by allowing signal propagation through the RLOW IMT devices.

Figure 4:
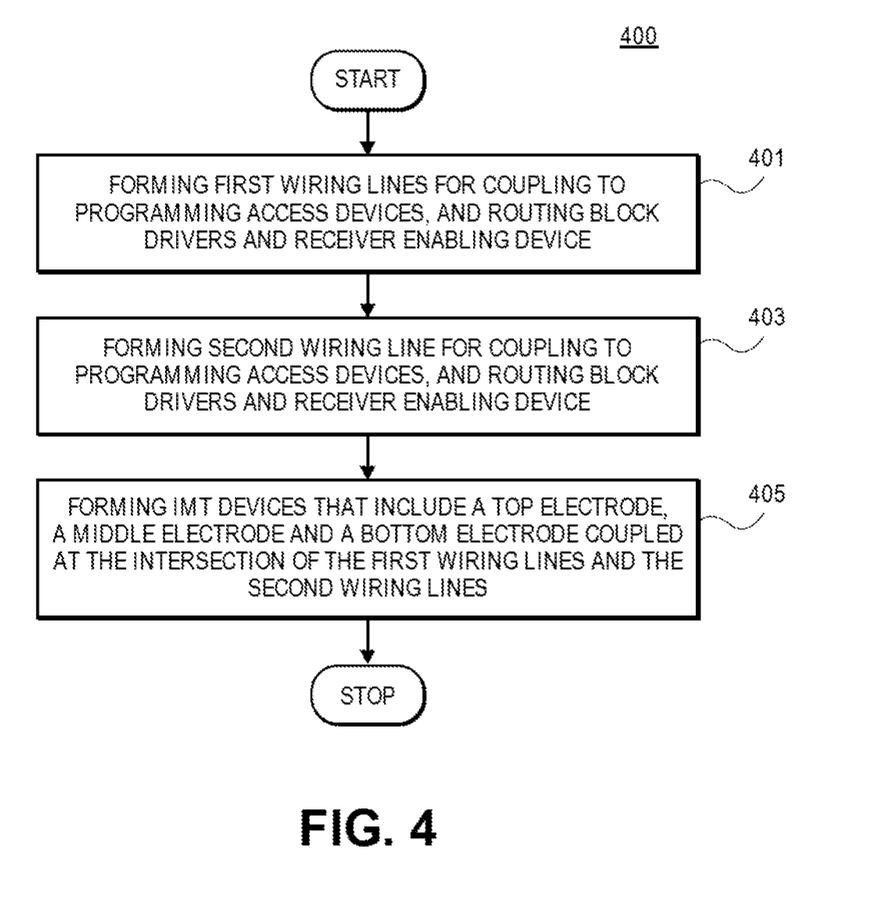
FIG. 4 is a flowchart of a method of forming an IMT device according to an embodiment.

FIG. 4 is a flowchart of operations performed in method for forming an IMT routing block for IMT based configurable routing according to an embodiment. Referring to FIG. 4, at 401, first wiring lines to be coupled to programming access devices and routing block drivers and receiver enabling devices is formed. At 403, second wiring lines to be coupled to programming access devices and outing block drivers and receiver enabling devices is formed. At 405, insulator-metal-transistor (IMT) devices comprising a top electrode, a middle electrode and a bottom electrode, coupled at the intersections of the first wiring lines and the second wiring lines are formed. In an embodiment, after the IMT routing block (e.g., 300 in FIG. 3) has been fabricated/formed according to 401-405, the IMT devices of the IMT routing block comprising a top electrode, a middle electrode and a bottom electrode, coupled at the intersections of the first wiring lines and the second wiring lines can be caused to allow signal propagation by programming its intersection IMT to RLOW.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
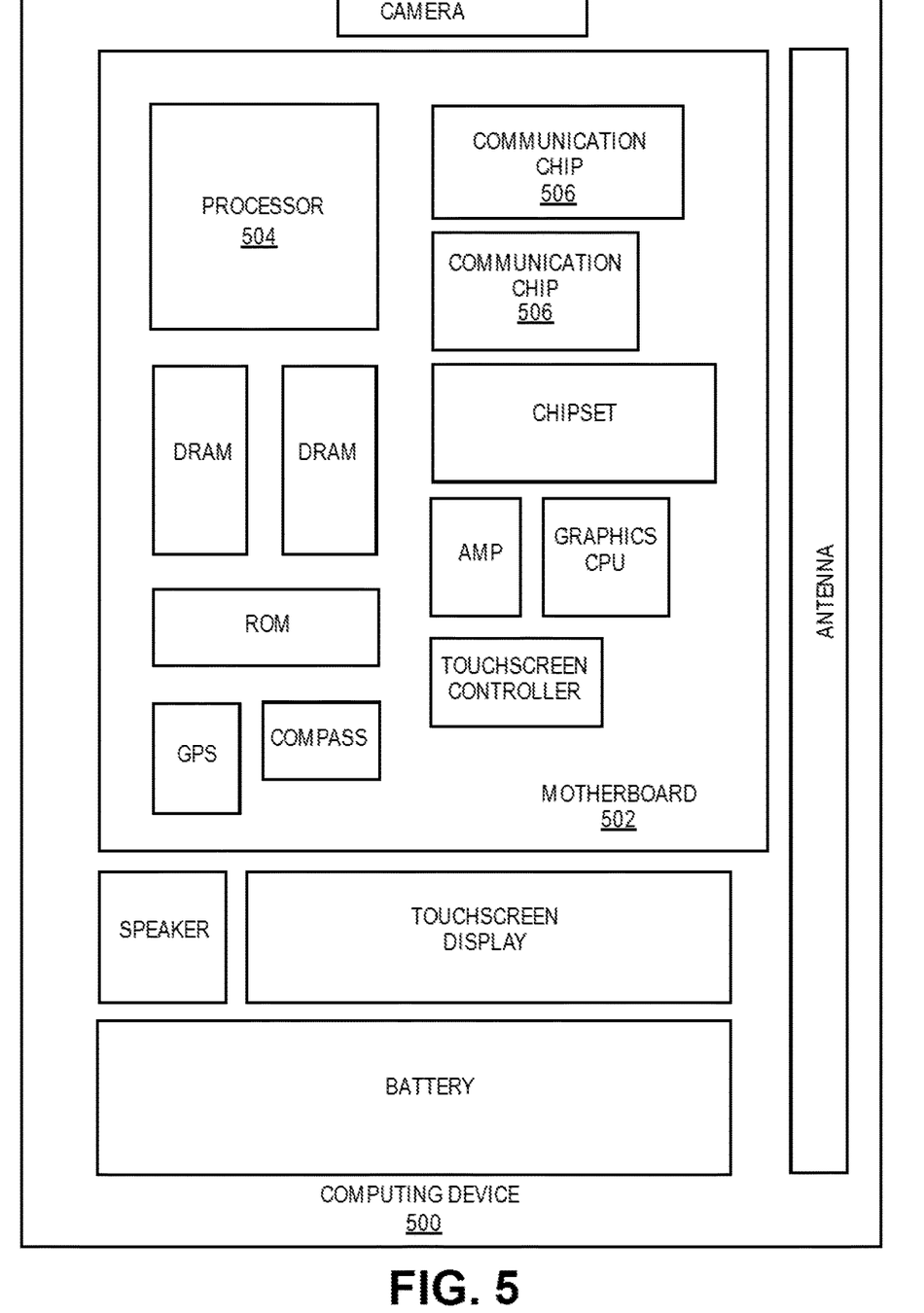
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
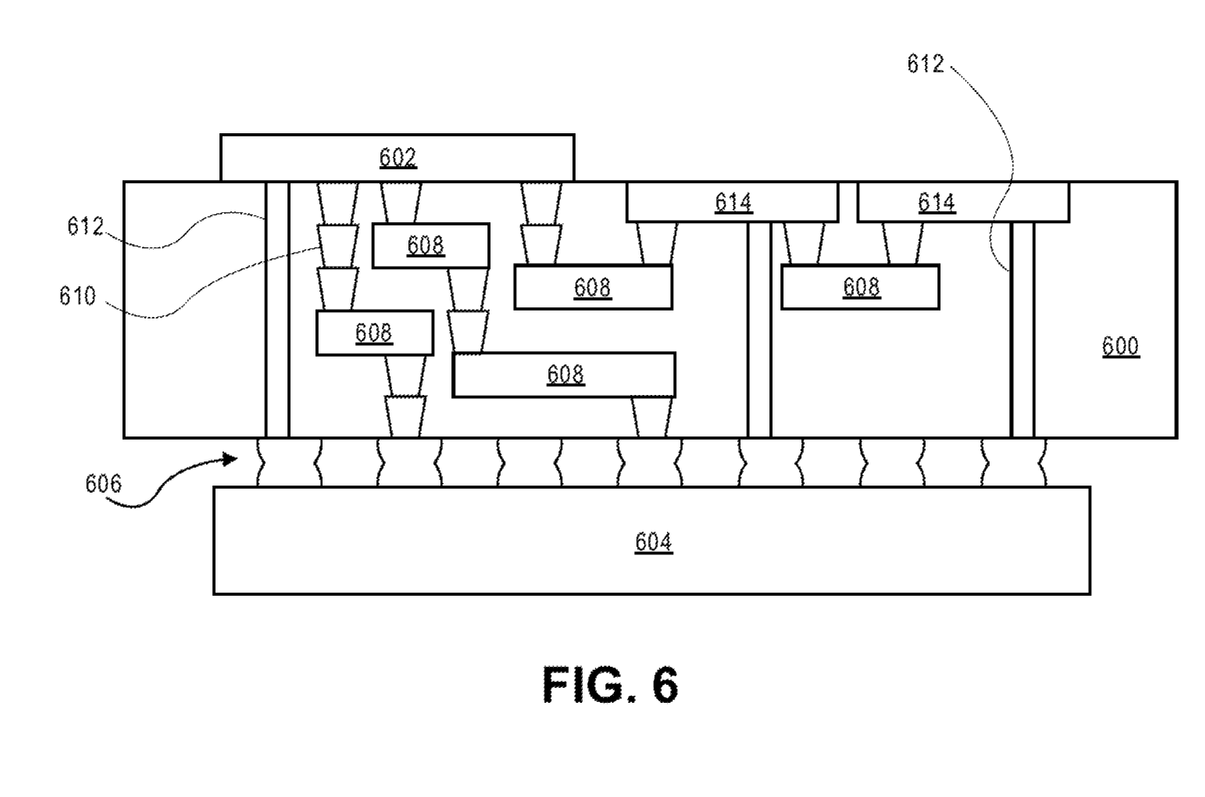
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A routing structure includes a first wiring line coupled to a programming access device and a routing block driver and receiver enabling device and a second wiring line coupled to a programming access device and a routing block driver and receiver enabling device. The routing structure further includes an insulator-metal-transistor (IMT) device comprising a top electrode, a middle electrode and a bottom electrode, coupled at the intersection of the first wiring line and the second wiring line.

Example Embodiment 2

The routing structure of example embodiment 1, wherein the IMT device is configured to conduct electrical signals in a RLOW state.

Example Embodiment 3

The routing structure of example embodiment 1, wherein the IMT device is a part of a RRAM free crosspoint.

Example Embodiment 4

The routing structure of example embodiment 1, wherein the IMT device is configured to assume a state determined by a programming voltage.

Example Embodiment 5

The routing structure of example embodiment 1, wherein the IMT device is configured to selectively couple inputs and outputs.

Example Embodiment 6

The routing structure of example embodiment 1, wherein the IMT device is configured to hold a configuration state until it is reconfigured.

Example Embodiment 7

The routing structure of example embodiments 1, 2, 3, 4, 5 and 6 wherein the IMT device is a part of an FPGA backend.

Example Embodiment 8

A routing structure includes a plurality of horizontal wiring lines coupled to programming access devices and routing block driver and receiver enabling devices, and a plurality of vertical wiring lines coupled to programming access devices and routing block driver and receiver enabling devices. The routing structure further includes a plurality of insulator-metal-transistor devices comprising a top electrode, a middle electrode and a bottom electrode, coupled at the intersection of the plurality of horizontal wiring lines and the plurality of vertical wiring lines.

Example Embodiment 9

The routing structure of example embodiment 8, wherein the IMT devices are configured to conduct electrical signals in a RLOW state.

Example Embodiment 10

The routing structure of example embodiment 9, wherein the IMT devices are a part of a RRAM free crosspoint.

Example Embodiment 11

The routing structure of example embodiment 9, wherein the IMT devices are configured to assume a state determined by a programming voltage.

Example Embodiment 12

The routing structure of example embodiment 9, wherein the IMT devices are configured to selectively couple inputs and outputs.

Example Embodiment 13

The routing structure of example embodiment 9, wherein the IMT devices are configured to hold a configuration state until it is reconfigured.

Example Embodiment 14

The routing structure of example embodiments 9, 10, 11, 12 or 13 wherein the IMT devices are a part of an FPGA backend.

Example Embodiment 15

A method includes forming a first wiring line to be coupled to a programming access device and a routing block driver and receiver enabling device and forming a second wiring line to be coupled to a programming access device and a routing block driver and receiver enabling device. The method further includes forming an insulator-metal-transistor (IMT) device comprising a top electrode, a middle electrode and a bottom electrode, coupled at the intersection of the first wiring line and the second wiring line.

Example Embodiment 16

The method of example embodiment 15, wherein the IMT device is configured to conduct electrical signals in a RLOW state.

Example Embodiment 17

The method of example embodiment 15, wherein the IMT device is a part of a RRAM free crosspoint.

Example Embodiment 18

The method of example embodiment 15, wherein the IMT device is configured to assume a state determined by a programming voltage.

Example Embodiment 19

The method of example embodiment 15, wherein the IMT device is configured to selectively couple inputs and outputs.

Example Embodiment 20

The method of example embodiments 15, 16, 17, 18 or 19 wherein the IMT device is configured to hold a configuration state until it is reconfigured.

What is claimed is:

1. A routing structure, comprising:
   a first wiring line coupled to a first programming access device and a routing block driver and receiver enabling device, wherein the first wiring line is formed in a first metallic layer;
   a second wiring line coupled to a second programming access device and a routing block driver and receiver enabling device, wherein the second wiring line is formed in a second metallic layer that is vertically displaced from the first metallic layer; and
   an insulator-metal-transition (IMT) device coupled at the intersection of the first wiring line and the second wiring line, the IMT device coupled directly to the first wiring line and to the second wiring line.

2. The routing structure of claim 1, wherein the IMT device is configured to conduct electrical signals in a RLOW state.

3. The routing structure of claim 1, wherein the IMT device is a part of a RRAM free crosspoint.

4. The routing structure of claim 1, wherein the IMT device is configured to assume a state determined by a programming voltage.

5. The routing structure of claim 1, wherein the IMT device is configured to selectively couple inputs and outputs.

6. The routing structure of claim 1, wherein the IMT device is configured to hold a configuration state until it is reconfigured.

7. The routing structure of claim 1, wherein the IMT device is a part of an FPGA backend.

8. A routing structure, comprising:
   a plurality of horizontal wiring lines coupled to first programming access devices and routing block driver and receiver enabling devices, wherein each of the horizonal wiring lines is formed in a first metallic layer;
   a plurality of vertical wiring lines coupled to second programming access devices and routing block driver and receiver enabling devices, wherein each of the vertical wiring lines is formed in a second metallic layer that is vertically displaced from the first metallic layer; and
   a plurality of insulator-metal-transition devices coupled at the intersection of the plurality of horizontal wiring lines and the plurality of vertical wiring lines, each of the insulator-metal- transistor devices coupled directly to a corresponding one of the plurality of horizontal wiring lines and to a corresponding one of the plurality of vertical wiring lines.

9. The routing structure of claim 8, wherein the IMT devices are configured to conduct electrical signals in a RLOW state.

10. The routing structure of claim 9, wherein the IMT devices are a part of a RRAM free crosspoint.

11. The routing structure of claim 9, wherein the IMT devices are configured to assume a state determined by a programming voltage.

12. The routing structure of claim 9, wherein the IMT devices are configured to selectively couple inputs and outputs.

13. The routing structure of claim 9, wherein the IMT devices are configured to hold a configuration state until it is reconfigured.

14. The routing structure of claim 9, wherein the IMT devices are a part of an FPGA backend.

15. A method, comprising:
    forming a first wiring line in a first metallic layer, wherein the first wiring line is to be coupled to a first programming access device and a routing block driver and receiver enabling device;
    forming a second wiring line in a second metallic layer that is vertically displaced from the second metallic layer, the second wiring line to be coupled to a second programming access device and a routing block driver and receiver enabling device; and
    forming an insulator-metal-transition (IMT) device coupled at the intersection of the first wiring line and the second wiring line, the IMT device coupled directly to the first wiring line and to the second wiring line.

16. The method of claim 15, wherein the IMT device is configured to conduct electrical signals in a RLOW state.

17. The method of claim 15, wherein the IMT device is a part of a RRAM free crosspoint.

18. The method of claim 15, wherein the IMT device is configured to assume a state determined by a programming voltage.

19. The method of claim 15, wherein the IMT device is configured to selectively couple inputs and outputs.

20. The method of claim 15, wherein the IMT device is configured to hold a configuration state until it is reconfigured.

* * * * *